United States Patent [19]
Pelley, III

[11] Patent Number: 5,313,120
[45] Date of Patent: May 17, 1994

[54] ADDRESS BUFFER WITH ATD GENERATION

[75] Inventor: Perry H. Pelley, III, Austin, Tex.

[73] Assignee: Motorola, Inc., Schaumburg, Ill.

[21] Appl. No.: 7,879

[22] Filed: Jan. 22, 1993

[51] Int. Cl.$^5$ .................. H03K 19/096; H03K 19/08; H03K 19/086; G11C 8/00

[52] U.S. Cl. .................. 307/480; 307/446; 307/455; 365/233.5

[58] Field of Search ............... 307/443, 446, 480, 481, 307/494, 570, 455; 365/233.5

[56] References Cited

U.S. PATENT DOCUMENTS

| | | | |
|---|---|---|---|
| 4,716,550 | 12/1987 | Flannagan et al. | 365/230.08 |
| 4,766,333 | 8/1988 | Mobley | 307/530 |
| 4,894,803 | 1/1990 | Aizaki | 365/233.5 |
| 4,922,461 | 5/1990 | Hayakawa et al. | 365/233.5 |
| 5,159,574 | 10/1992 | Kim et al. | 365/233.5 |
| 5,202,594 | 4/1993 | Chang | 307/443 |

OTHER PUBLICATIONS

Takashi Akioka et al., "A 6-ns 256-kb BiCMOS TTL SRAM", IEEE Jounral of Solid-State Circuits, Mar. 1991, vol. 26, No. 3, Fig. 8, p. 442.

*Primary Examiner*—Edward P. Westin
*Assistant Examiner*—Benjamin D. Driscoll
*Attorney, Agent, or Firm*—Daniel D. Hill

[57] ABSTRACT

An address buffer (20) provides an ATD pulse in response to an address signal transitioning from one logic state to another. The address buffer (20) includes a differential amplifier (22), an emitter-follower transistor (35), and two P-channel transistors (36 and 37). A first current electrode of each of the P-channel transistors is connected to the output nodes (101 and 102) of the differential amplifier (22), and a second current electrode of each of the P-channel transistors (36 and 37) is connected to the base of the emitter-follower transistor (35). Delayed control signals are provided to the gates of the P-channel transistors (36 and 37) by a level converter circuit (60) to cause an ATD pulse to be provided at the emitter of the emitter-follower transistor (35). Generating the ATD pulse in the address buffer allows the ATD pulse to be produced very quickly.

16 Claims, 4 Drawing Sheets

ADDRESS BUFFER WITH ATD GENERATION

CROSS-REFERENCE TO RELATED, COPENDING APPLICATIONS

Related, copending applications:
1. "BICMOS Level Converter Circuit", by Perry H. Pelley, III et al., Ser. No. 07/951,959, assigned to the assignee hereof, and filed Sep. 29, 1992;
2. "Power Supply Dependent Input Buffer", by Hamed Ghassemi et al., Ser. No. 07/953,153, assigned to the assignee hereof, and filed Sep. 29, 1992; and
3. "ATD Pulse Generator Circuit for a Memory", by Ruey Yu, Ser. No. 07/928,389, assigned to the assignee hereof, and filed Aug. 12, 1992.

FIELD OF THE INVENTION

This invention relates generally to address transition detection (ATD), and more particularly, to an address buffer with ATD generation.

BACKGROUND OF THE INVENTION

Integrated circuit memories, such as static random access memories (SRAMs) require increasingly short access times. SRAMs are often used in the portion of a processing system where speed is very important, such as in a cache memory for a microprocessor. Address transition detection is one method that has been used to decrease access times by allowing a memory access to begin as soon as a change in the address is detected. ATD decreases memory access times, and also may reduce power consumption, by providing both preconditioning signals and activation signals in the memory. ATD is generally used in a memory to provide data line precharge and equalization signals. In addition, ATD may be used for word line driving, bit line driving, data line sensing, and for data outputting.

In a memory using ATD, an address transition detector provides a pulse in response to an address change. It is typical to have a separate address transition detector for each address signal for which transitions are to be detected. For example, if a transition of the row address is to be detected, then an address transition detector is commonly used for each row address signal. The output pulses of these detectors are then summed to provide a single pulse. In this example, a single pulse is provided when a change in any row address signal is detected.

The access time of a memory using ATD is often related to the time it takes to generate an ATD pulse after an address change. The more rapidly an ATD pulse can be generated, the earlier a memory using ATD can be accessed, thus increasing the speed of the memory.

SUMMARY OF THE INVENTION

Accordingly, there is provided, in one form, an input buffer having a differential amplifier, first and second MOS transistors, and an emitter-follower transistor. The differential amplifier has an input terminal for receiving an input signal, and first and second output nodes. The input signal has first and second logic states. The first MOS transistor has a first current electrode coupled to the first output node of the differential amplifier, a second current electrode, and a gate for receiving a first control signal. The second MOS transistor has a first current electrode coupled to the second output node of the differential amplifier, a second current electrode, and a gate for receiving a second control signal. The emitter-follower transistor has a base coupled to the second current electrode of both the first and second MOS transistors, and an emitter. The input signal transitions from the first logic state to the second logic state, and in response, the emitter provides an output pulse. These and other features and advantages will be more clearly understood from the following detailed description taken in conjunction with the accompanying drawings.

DESCRIPTION OF A PREFERRED EMBODIMENT

Figure 1:
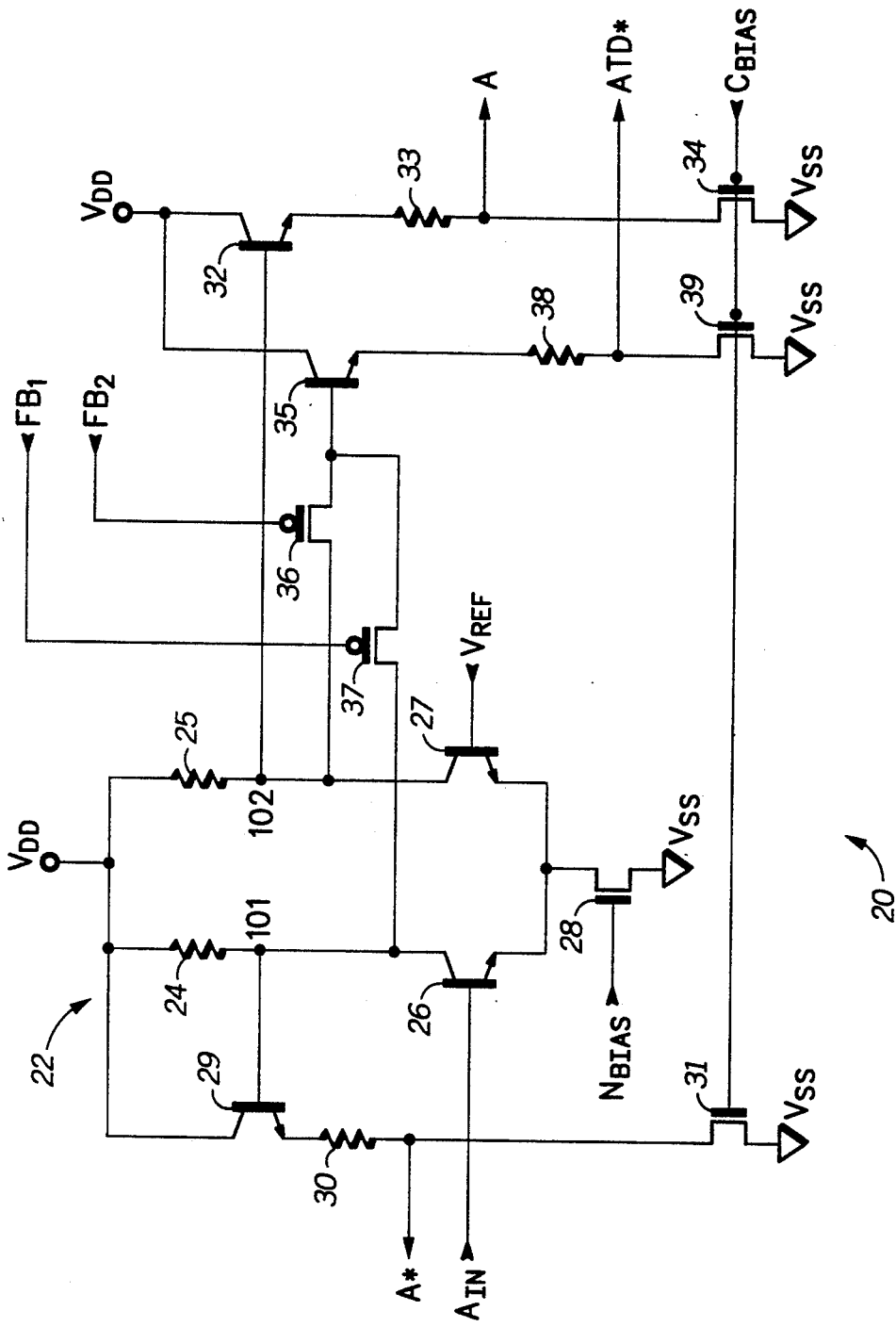
FIG. 1 illustrates in schematic diagram form an address buffer with ATD generation in accordance with the present invention.

FIG. 1 illustrates in schematic diagram form address buffer 20 with ATD generation in accordance with the present invention. Address buffer 20 includes differential amplifier 22, emitter-follower transistors 29, 32, and 35, resistors 30, 33, and 38, P-channel transistors 36 and 37, and N-channel transistors 31, 34, and 39. Differential amplifier 22 includes resistors 24 and 25, NPN transistors 26 and 27, and N-channel transistor 28.

Resistor 24 of differential amplifier 22 has a first terminal connected to a positive power supply voltage terminal labeled "$V_{DD}$", and a second terminal connected to output node 101. Resistor 25 has a first terminal connected to $V_{DD}$, and a second terminal connected to output node 102. NPN transistor 26 has a collector connected to the second terminal of resistor 24 at output node 101, a base for receiving an ECL level single-ended address signal labeled "$A_{IN}$", and an emitter. NPN transistor 27 has a collector connected to the second terminal of resistor 25 at output node 102, a base for receiving a reference voltage labeled "$V_{REF}$", and emitter connected to the emitter of NPN transistor 26. N-channel transistor 28 has a drain connected to the emitters of NPN transistors 26 and 27, a gate for receiving a bias voltage labeled "$N_{BIAS}$", and a source connected to a negative power supply voltage terminal labeled "$V_{SS}$". Nodes 101 and 102 are output nodes of differential amplifier 22. Power supply voltage terminal $V_{DD}$ receives a power supply voltage equal to approximately 3.0 volts, and power supply voltage terminal $V_{SS}$ is ground.

Emitter-follower transistor 29 has a collector connected to $V_{DD}$, a base connected to the second terminal of resistor 24 at output node 101, and an emitter. Resistor 30 has a first terminal connected to the emitter of emitter-follower transistor 29, and a second terminal for providing a buffered signal labeled "A*". N-channel transistor 31 has a drain connected to the second terminal of resistor 30, a gate for receiving a power supply dependent bias voltage labeled "$C_{BIAS}$", and a source connected to $V_{SS}$. Emitter-follower transistor 32 has a collector connected to $V_{DD}$, a base connected to the second terminal of resistor 25 at output node 102, and an emitter. Emitter-follower transistors 29, 32, and 35 are NPN transistors. Resistor 33 has a first terminal connected to the emitter of emitter-follower transistor 32, and a second terminal for providing a buffered signal labeled "A". N-channel transistor 34 has a drain connected to the second terminal of resistor 33, a gate for receiving power supply dependent bias voltage $C_{BIAS}$, and a source connected to $V_{SS}$. Emitter-follower transistor 35 has a collector connected to $V_{DD}$, a base, and an emitter. P-channel transistor 36 has a first current electrode connected to the second terminal of resister 25 at output node 102, a gate for receiving a control signal labeled "$FB_2$", and a second current electrode connected to the base of emitter-follower transistor 35. P-channel transistor 37 has a first current electrode connected to the second terminal of resistor 24 at output node 101, a gate for receiving a control signal labeled "$FB_1$", and a second current electrode connected to the base of emitter-follower transistor 35. Resistor 38 has a first terminal connected to the emitter of emitter-follower transistor 35, and a second terminal for providing an ATD pulse labeled "ATD*". N-channel transistor 39 has a drain connected to the second terminal of resistor 38, a gate for receiving bias signal $C_{BIAS}$, and a source connected to negative power supply terminal $V_{SS}$. (Note that an asterisk "*" after a signal name indicates that the signal is a logical complement of a signal having the same name but lacking the asterisk "*".) All of the N-channel and P-channel transistors are MOS (metal-oxide semiconductor) transistors.

In operation, single-ended ECL level address signal $A_{IN}$ is received by address buffer 20 at the base of NPN transistor 26. Address signal $A_{IN}$ swings between an ECL logic high voltage of about 1.6 volts and an ECL logic low voltage of about 0.8 volts. N-channel transistor 28 receives bias voltage $N_{BIAS}$ and provides a relatively constant current source for differential amplifier 22. $N_{BIAS}$ is provided at about 1.2 to 1.4 volts. Reference voltage $V_{REF}$ is provided to the base of NPN transistor 27 at a voltage level approximately at the midpoint of the logic swing of ECL level address signal $A_{IN}$. If address signal $A_{IN}$ is a logic low, it is more negative than reference voltage $V_{REF}$, causing NPN transistor 26 to be substantially non-conductive and NPN transistor 27 to be conductive. A current designated as "$I_{28}$", through N-channel transistor 28, is steered through NPN transistor 27, and the voltage at output node 102 is equal to $V_{DD}$ minus $I_{28}R_{25}$ where $R_{25}$ is the resistance of resistor 25. The voltage at output node 101 is equal to approximately $V_{DD}$ since there is substantially no current flow through NPN transistor 26. Likewise, if address signal $A_{IN}$ is equal to a logic high voltage, it is less negative than $V_{REF}$, causing NPN transistor 26 to be conductive and NPN transistor 27 to be substantially non-conductive. Current $I_{28}$ is steered through NPN transistor 26 and the voltage at output node 101 is equal to $V_{DD}$ minus $I_{28}R_{24}$ where $R_{24}$ is the resistance of resistor 24, and the voltage at output node 102 will be equal to approximately $V_{DD}$. Therefore, the difference between a logic high and a logic low voltage at nodes 101 and 102 is equal to the voltage drop across either of resistors 24 or 25. In the preferred embodiment, $R_{24}$ is equal to approximately $R_{25}$.

The emitter of emitter-follower transistor 29 provides a voltage equal to the voltage at output node 101 minus one base-emitter diode voltage drop ($V_{BE}$), where one $V_{BE}$ is equal to approximately 0.8 volts. The emitter of transistor 32 provides a voltage equal to the voltage at output node 102 minus one $V_{BE}$. Resistors 30 and 33 perform a level shift function by reducing the voltage provided by emitter-follower transistors 29 and 32. The amount of level shift, or voltage drop, provided by resistors 30 and 33 depends on the amount of current provided by N-channel transistors 31 and 34 and the resistance of resistors 30 and 33.

Figure 2:
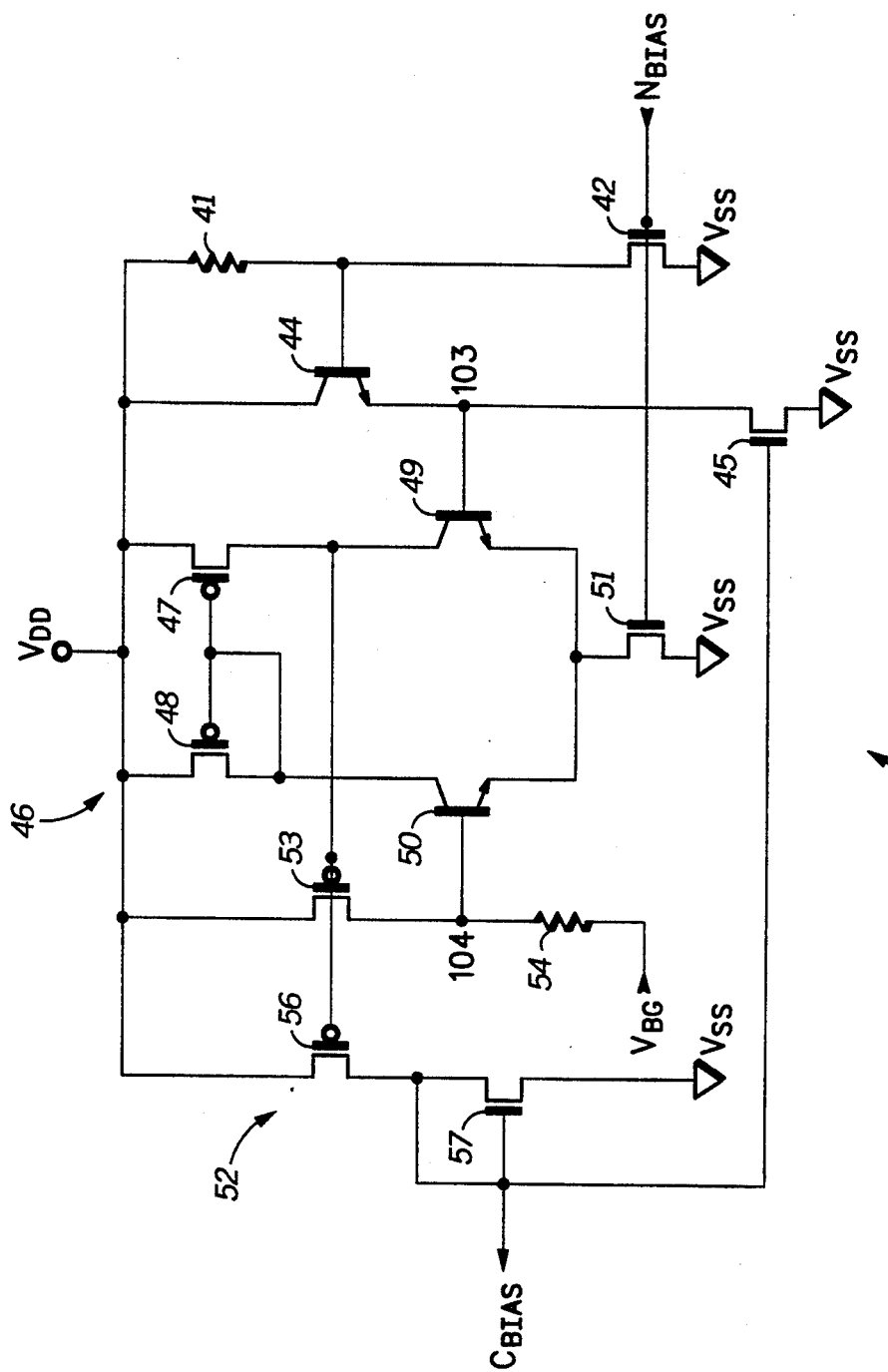
FIG. 2 illustrates in schematic diagram form a power supply dependent bias voltage generator circuit in accordance with the present invention.

In the preferred embodiment, resistors 30 and 33 are sized so that buffered signals A and A* swing between an intermediate logic high voltage of about 1.6 volts and a logic low voltage of about 1.0 volt. Power supply dependent bias voltage $C_{BIAS}$ varies with $V_{DD}$ and determines the amount of current provided by N-channel transistors 31 and 34. N-channel transistors 31 and 34 function as current sources. For example, if $V_{DD}$ is chosen to be 3.3 volts, $V_{DD}$ may fluctuate between 2.8 and 4.0 volts. An increase in $V_{DD}$ causes bias voltage $C_{BIAS}$ to increase, and a decrease in $V_{DD}$ causes bias voltage $C_{BIAS}$ to decrease. When $C_{BIAS}$ increases, the current provided by N-channel transistors 31 and 34 increases. Increased current flow increases the voltage drop across resistors 30 and 33. Likewise, a decrease in $V_{DD}$ reduces bias voltage $C_{BIAS}$, which decreases the voltage drop across resistors 30 and 33 because N-channel transistors 31 and 34 provide less current. Therefore, buffered signals A and A* remain constant with respect to $V_{SS}$, or ground, and independent of changes in $V_{DD}$. The circuit that provides $C_{BIAS}$ is illustrated in FIG. 2 and will be discussed later. Since buffered signals A and A* are referenced to $V_{SS}$, better margins and increased signal swings are realized in subsequent stages, even at low power supply voltages.

Emitter-follower transistor 35 is coupled to both nodes 101 and 102 by P-channel transistors 36 and 37. The voltage at the base of emitter-follower transistor 35 is equal to the voltage at output node 101 or output node 102, depending on which of transistors 36 or 37 is conductive. Since the power supply voltage is equal to about 3.0 volts, it is important that there is little or no voltage drop across either of P-channel transistors 36 and 37 when they are conductive. The threshold voltage of P-channel transistors 36 and 37 is about 1.0 volt when the power supply voltage is equal to approximately 3.0 volts. Resistor 38 and N-channel transistor 39 provides a level shift, or voltage drop function as described above for resistors 30 and 33.

Control signals $FB_1$ and $FB_2$ are at BICMOS level logic signals and are provided to the gates of P-channel transistors 37 and 36, respectively. BICMOS circuits are constructed by including bipolar transistors and complementary metal-oxide-semiconductor (CMOS) transistors on the same integrated circuit. In this case, a BICMOS logic high voltage is equal to $V_{DD}$ minus one $V_{BE}$, and a BICMOS logic low voltage is equal to approximately $V_{SS}$ plus one $V_{BE}$. Control signals $FB_1$ and $FB_2$ change logic states a predetermined time, or delay, after address signal $A_{IN}$ transitions from one logic state to another. In the preferred embodiment, control signals $FB_1$ and $FB_2$ are provided by level converter 60 (shown in FIG. 3) as feed back signals. When address signal $A_{IN}$ transitions from one logic state to the next, there is approximately a 1.2 to 1.4 nanosecond propagation delay before control signals $FB_1$ and $FB_2$ change logic states. In other embodiments, control signals $FB_1$ and $FB_2$ may be provided from other sources, as long as the necessary signal swing is available to properly switch P-channel transistors 36 and 37. Also, note that address buffer 20 is an input buffer and is not limited to the detection of address signal transitions. The transition of other types input signals can be detected as well, such as data signals.

FIG. 2 illustrates in schematic diagram form, power supply dependent bias voltage generator circuit 40 in accordance with the present invention. Power supply dependent bias voltage circuit 40 includes resistors 41 and 54, NPN transistor 44, differential amplifier 46, N-channel transistors 42, 45, and 57, and current mirror 52. Differential amplifier 46 includes P-channel transistors 47 and 48, NPN transistors 49 and 50, and N-channel transistor 51. P-channel transistors 47 and 48 function as loads for differential amplifier 46. Current mirror 52 includes P-channel transistors 53 and 56.

Resistor 41 has a first terminal connected to $V_{DD}$, and a second terminal. N-channel transistor 42 has a drain connected to the second terminal of resistor 41, a gate for receiving $N_{BIAS}$, and a source connected to $V_{SS}$. NPN transistor 44 has a collector connected to $V_{DD}$, a base connected to the second terminal of resistor 41, and an emitter connected to node 103. N-channel transistor 45 has a drain connected to the emitter of NPN transistor 44 at node 103, a gate for receiving power supply dependent bias voltage $C_{BIAS}$, and a source connected to $V_{SS}$.

P-channel transistor 47 of differential amplifier 46 has a source connected to $V_{DD}$, a gate, and a drain. P-channel transistor 48 has a source connected to $V_{DD}$, and a gate and a drain connected to the gate of P-channel transistor 47. NPN transistor 49 has a collector connected to the drain of P-channel transistor 47, a base connected to the emitter of NPN transistor 44 at node 103, and an emitter. NPN transistor 50 has a collector connected to the drain of P-channel transistor 48, a base connected to node 104, and an emitter connected to the emitter of NPN transistor 49. N-channel transistor 51 has a drain connected to the emitters of NPN transistors 49 and 50, a gate for receiving bias voltage $N_{BIAS}$, and a source connected to $V_{SS}$.

P-channel transistor 53 of current mirror 52 has a source connected to $V_{DD}$, a gate connected to the drain of P-channel transistor 47, and a drain connected to the base of NPN transistor 50 at node 104. P-channel transistor 56 has a source connected to $V_{DD}$, a gate connected to the gate of P-channel transistor 53, and a drain for providing power supply dependent bias voltage $C_{BIAS}$. Resistor 54 has a first terminal connected to the base of transistor 50 at node 104, and a second terminal for receiving a band gap voltage labeled "$V_{BG}$". N-channel transistor 57 has a gate and a drain connected to the drain of P-channel transistor 56, and a source connected to $V_{SS}$.

In operation, N-channel transistor 42 provides a relatively constant current source for resistor 41, making the voltage drop across resistor 41 relatively constant with respect to $V_{DD}$. NPN transistor 44 provides a voltage to the base of NPN transistor 49 at node 103 that is approximately equal to the voltage at the second terminal of resistor 41, minus one $V_{BE}$. Since the voltage drop across resistor 41 is relatively constant with respect to $V_{DD}$, the voltage at node 103 is also relatively constant with respect to $V_{DD}$. P-channel transistors 47 and 48 form a current mirror, causing the collector current of NPN transistor 50 to follow the collector current of NPN transistor 49. P-channel transistor 53 and resistor 54 complete a feedback path from the base of NPN transistor 50 to the collector of NPN transistor 49. Therefore, the voltage at node 104 follows the variations of the voltage at node 103, and the voltage at nodes 103 and 104 are approximately equal.

Bandgap voltage $V_{BG}$ is a conventional bandgap generated reference voltage and is provided to the second terminal of resistor 54. A bandgap generated reference voltage is substantially independent of changes in power supply voltage, temperature, and processing. Therefore, the voltage drop across resistor 54 varies proportionally to $V_{DD}$, causing the drain-source current through P-channel transistor 53 to vary as $V_{DD}$ varies. P-channel transistors 53 and 56 form current mirror 52. As the drain-source current through P-channel transistor 53 changes, the drain-source current through P-channel transistor 56 "mirrors" the change in drain-source current. The gate-to-source voltage of N-channel transistor 57 provides power supply dependent bias voltage $C_{BIAS}$. N-channel transistor 57 remains in saturation. Therefore, the drain-source current of N-channel transistor 57 changes as $V_{DD}$ changes. If $V_{DD}$ increases, power supply dependent bias voltage $C_{BIAS}$ increases, and if $V_{DD}$ decreases, bias voltage $C_{BIAS}$ decreases.

The characteristics of some integrated circuit devices change with respect to temperature, process, or power supply variations. Power supply dependent bias voltage generator circuit 40 matches the temperature variations of address buffer 20. NPN transistor 44 of power supply dependent bias voltage circuit 40 tracks the $V_{BE}$ voltage shifts of NPN transistors 29, 32, and 35 of address buffer 20, illustrated in FIG. 1. When the current provided to transistors 29, 32, and 35 by N-channel transistors 31, 34, and 39 changes with respect to power supply, temperature, or process changes, the current provided to NPN transistor 44 by N-channel transistor 45 also changes, causing the $V_{BE}$ voltage drop across NPN transistor 29 or 32 to be the same as the voltage drop across NPN transistor 44. Also, current tracking is accomplished by providing bias voltage $C_{BIAS}$ to the gate of N-channel transistor 45. In addition, resistor 54 tracks the temperature variations of resistors 30, 33, and 38.

Figure 3:
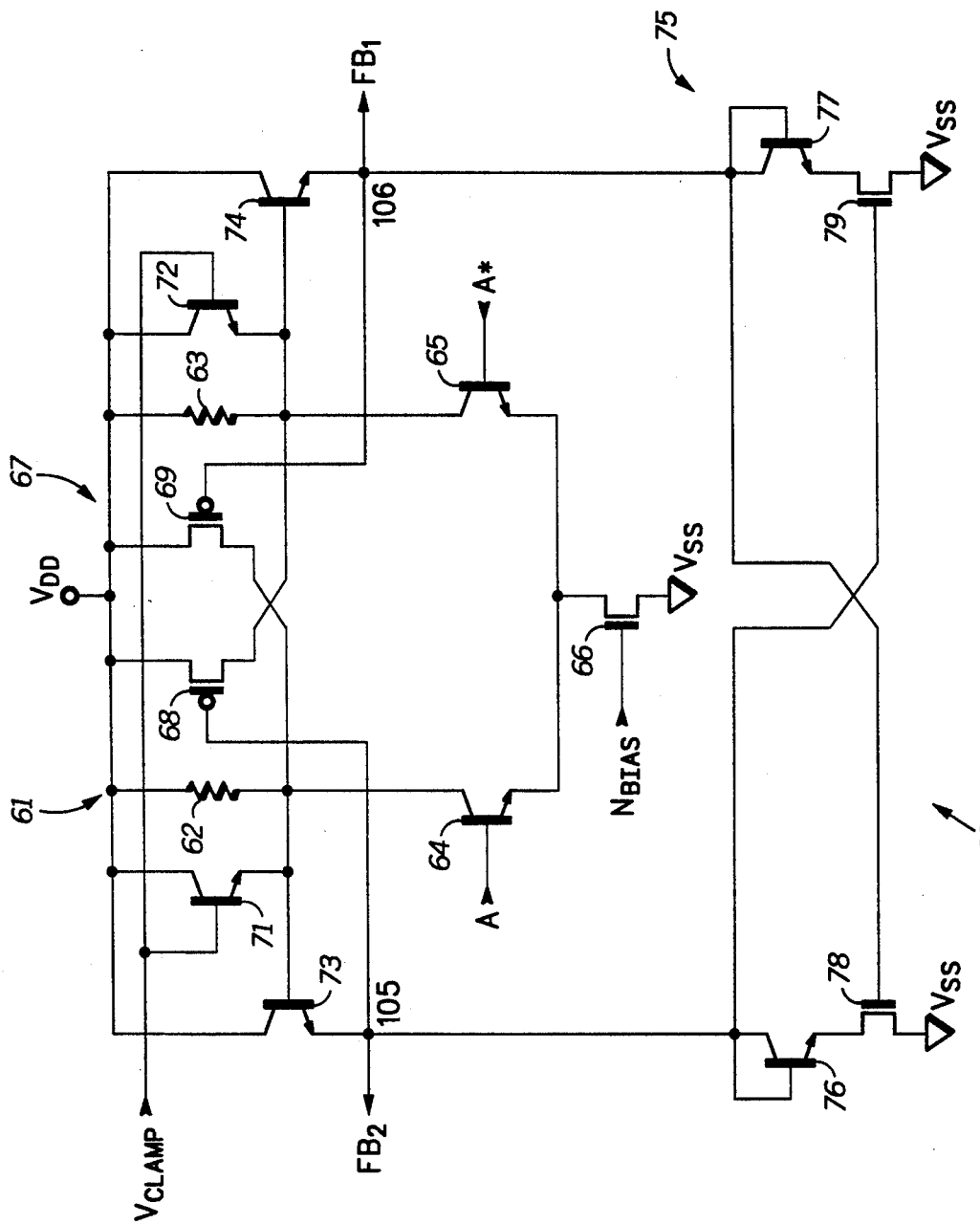
FIG. 3 illustrates in schematic diagram form a level converter in accordance with the present invention.

FIG. 3 illustrates in partial schematic diagram form level converter 60 in accordance with the present invention. Level converter 60 includes differential amplifier 61, cross-coupled pull-up circuit 67, NPN transistors 71, 72, 73, and 74, and cross-coupled half-latch 75. Differential amplifier 61 includes resistors 62 and 63, NPN transistors 64 and 65, and N-channel transistor 66. Cross-coupled half-latch 75 includes NPN transistors 76 and 77 and N-channel transistors 78 and 79.

Resistor 62 of differential amplifier 61 has a first terminal connected to a power supply voltage terminal labeled "$V_{DD}$", and a second terminal. Resistor 63 has a first terminal connected to $V_{DD}$, and a second terminal. NPN transistor 64 has a collector connected to the second terminal of resistor 62, a base for receiving buffered signal A, and an emitter. NPN transistor 65 has a collector connected to the second terminal of resistor 63, a base for receiving buffered signal A*, and an emitter connected to the emitter of NPN transistor 64. N-channel transistor 66 has a drain connected to the emitters of transistors 64 and 65, a gate for receiving bias voltage $N_{BIAS}$, and a source connected to $V_{SS}$.

Cross-coupled pull-up circuit 67 includes P-channel transistors 68 and 69. P-channel transistor 68 has a source connected to $V_{DD}$, a gate connected to the emitter of NPN transistor 73 at node 105, and a drain connected to the second terminal of resistor 63. P-channel transistor 69 has a source connected to $V_{DD}$, a gate connected to the emitter of transistor 74 at node 106, and a drain connected to the second terminal of resistor 62.

NPN transistor 71 has a collector connected to $V_{DD}$, a base for receiving a bias voltage labeled "$V_{CLAMP}$", and an emitter connected to the second terminal of resistor 62. NPN transistor 72 has a collector connected to $V_{DD}$, a base for receiving bias voltage $V_{CLAMP}$, and an emitter connected to the second terminal of resistor 63. Emitter-follower transistor 73 is an NPN transistor and has a collector connected to $V_{DD}$, a base connected to the second terminal of resistor 62, and an emitter for providing control signal $FB_2$ at node 105. Emitter-follower transistor 74 is also an NPN transistor and has a collector connected to $V_{DD}$, a base connected to the second terminal of resistor 63, and an emitter for providing control signal $FB_1$ at node 106. NPN transistor 76 has a base and a collector connected to the emitter of emitter-follower transistor 73 at node 105, and an emitter. NPN transistor 77 has a base and a collector connected to the emitter of emitter-follower transistor 74 at node 106, and an emitter. NPN transistors 76 and 77 are diode-connected transistors and function as diodes. N-channel transistor 78 has a drain connected to the emitter of NPN transistor 76, a gate connected to the collector of NPN transistor 77, and a source connected to $V_{SS}$. N-channel transistor 79 has a drain connected to the emitter of NPN transistor 77, a gate connected to the collector of NPN transistor 76, and a source connected to $V_{SS}$.

In operation, level converter 60 receives buffered signals A and A* from address buffer 20 of FIG. 1, and provides control signals $FB_1$ and $FB_2$ at nodes 106 and 105, respectively. Note that the signals at nodes 105 and 106 are also provided to subsequent address decoding circuits, such as address predecoders, which are not shown. Buffered signals A and A* are differential signals that swing between an intermediate logic high voltage of 1.6 volts and an intermediate logic low voltage of 1.0 volt. If buffered signal A is at an intermediate logic high voltage and buffered signal A* is at an intermediate logic low voltage, then a current designated as $I_{66}$ through N-channel transistor 66 is steered through NPN transistor 64 so that the voltage at the base of emitter-follower transistor 73 is reduced, causing emitter-follower transistor 73 to be substantially non-conductive. The voltage at the base of emitter-follower transistor 74 is increased causing emitter-follower transistor 74 to be conductive. When transistor 74 is conductive, node 106 is a logic high voltage equal to approximately $V_{DD}$ minus one $V_{BE}$.

When node 106 is a logic high voltage, and emitter-follower transistor 73 is substantially non-conductive, N-channel transistor 78 is conductive, thus reducing the voltage at node 105 to a logic low voltage. When node 105 is reduced to a logic low voltage of about 0.6 volts, diode-connected NPN transistor 76 becomes substantially non-conductive, causing N-channel transistor 78 to become substantially non-conductive. If N-channel transistor 78 remained conductive, current would continue to flow unnecessarily, thus increasing power consumption. Since node 105 is a low voltage, the voltage at the gate of N-channel transistor 79 is low enough to cause N-channel transistor 79 to be substantially non-conductive. Also, a low voltage at node 105 causes P-channel transistor 68 of cross-coupled pull-up circuit 67 to be conductive, which helps to increase the voltage at the base of emitter-follower transistor 74 more rapidly.

If buffered signal A is an intermediate logic low and buffered signal A* is an intermediate logic high, then a current designated as $I_{66}$ through N-channel transistor 66 is steered through NPN transistor 65. The voltage at the base of emitter-follower transistor 74 is reduced, resulting in emitter-follower transistor 74 becoming substantially non-conductive. The voltage at the base of emitter-follower transistor 73 is a logic high causing emitter-follower transistor 73 to become conductive, and node 105 is a logic high voltage equal to $V_{DD}$ minus one $V_{BE}$. When node 105 is a logic high voltage and emitter follower transistor 74 is non-conductive, N-channel transistor 79 is conductive, thus reducing the voltage at node 106 to a logic low. Since node 106 is low, N-channel transistor 78 is substantially non-conductive. When the voltage at node 106 reduced to a logic low, P-channel transistor 69 is conductive, which helps to increase the voltage at the base of NPN transistor 73 more rapidly.

In other embodiments, the gates of P-channel transistors 68 and 69 may be connected to the second terminals of resistors 62 and 63, respectively. This provides a higher voltage to the gates of transistors 68 and 69, thus causing them to be less conductive and reducing the amount of base drive provided to emitter-follower transistors 73 and 74.

Cross-coupled half-latch 75 provides the advantage of reduced power consumption. N-channel transistors 78 and 79 are cross-coupled and are conductive only when necessary to reduce the voltage of nodes 105 or 106 to a logic low. Diode-connected NPN transistors 76 and 77 prevent a leakage current from flowing, thus ensuring that N-channel transistors 78 and 79 remain non-conductive during a logic low state.

Resistors 62 and 63 are sized appropriately to account for power supply variations. They are sized relatively large to prevent diode-connected NPN transistors 76 and 77 from becoming conductive at high power supply voltages. As the power supply voltage increases, the voltage at nodes 105 and 106 tends to increase. If a logic low voltage at node 105 or 106 increases above about 0.6 voltages, the base-emitter voltage of diode-connected NPN transistors 76 and 77 increases above 0.6 volts, and N-channel transistors 78 and 79 may become, at least partially, conductive when they should be substantially non-conductive. But, if resistors 62 and 63 are too large, the speed of level converter 60 may be adversely affected.

For very high speed operation, differential amplifier 61 and cross-coupled pull-up circuit 67 may be provided with a regulated power supply voltage. If a regulated power supply voltage is used, the size of resistors 62 and 63 may be reduced to allow for the reduced power supply variation.

A clamping circuit, comprising NPN transistors 71 and 72 and bias voltage $V_{CLAMP}$, prevents NPN transistors 64 and 65 from operating in the saturation region. Generally, a bipolar transistor operates in the saturation region when both the base-emitter and base-collector junctions are forward biased by more than approximately 0.7 volts. The base-collector junction of NPN transistors 64 and 65 may become forward biased as a result of several different conditions. For example, if buffered signals A and A* are allowed to increase to a high voltage level as a result of power supply fluctuations, NPN transistors 64 and 65 may operate in saturation. Also, if the drain-source current provided by N-channel transistor 66 is allowed to vary, the collector voltage of NPN transistors 64 or 65 may be reduced to a level that will cause NPN transistors 64 and 65 to operate in saturation. Bias voltage $V_{CLAMP}$ is provided to the bases of NPN transistors 71 and 72 at about 2.1 volts, preventing the collectors of NPN transistors 64 and 65 from going below about 1.3 volts. This causes NPN transistor 64 and 65 to stay in the active region of operation. Operating NPN transistors 64 and 65 in the active region provides the advantage of increased operating speed.

Figure 4:
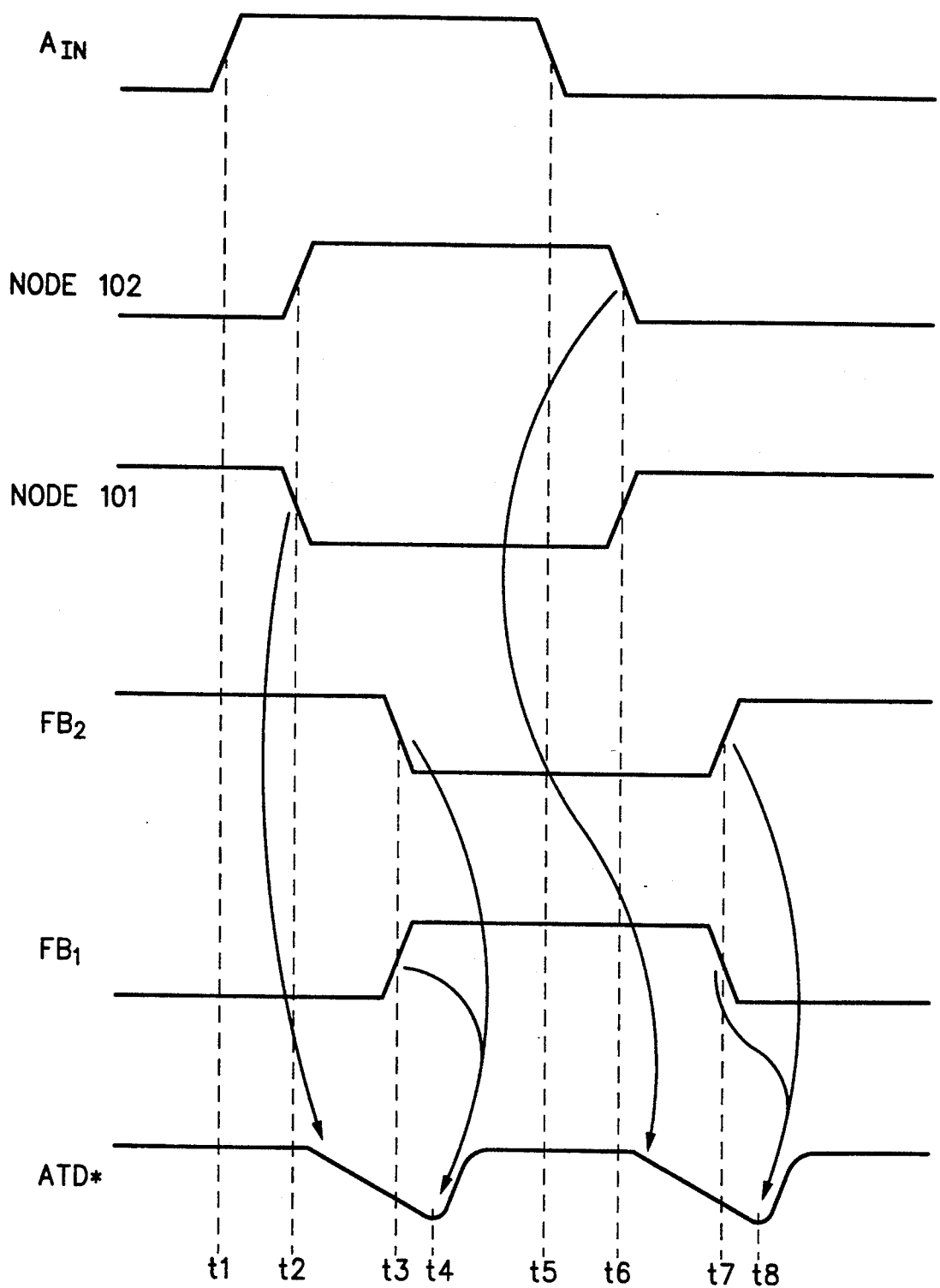
FIG. 4 shows a timing diagram of various signals of the address buffer with ATD generation of FIG. 1 in accordance with the present invention.

FIG. 4 shows a timing diagram of various signals of address buffer 20 of FIG. 1 in accordance with the present invention. (Note that the timing diagram of FIG. 4 is not drawn to scale.) Before time t1, address signal $A_{IN}$ is shown at a low logic state. Referring back to FIG. 1, when address signal $A_{IN}$ is a logic low, output node 102 is a logic low and output node 101 is a logic high. Control signal $FB_1$ is a logic low voltage causing P-channel transistor 37 (FIG. 1) to be conductive. P-channel transistor 37 provides the voltage at output node 101 to the base of emitter-follower transistor 35, causing emitter-follower transistor 35 to be at a logic high. Therefore, prior to time t1, ATD pulse ATD* is provided at a logic high voltage.

At time t1, address signal $A_{IN}$ transitions to a logic high voltage, which reverses the logic states of nodes 101 and 102, as shown occurring at time t2. As the voltage at output node 101 decreases to a logic low voltage, the voltage at the base of emitter-follower transistor 35 begins to decrease, since P-channel transistor 37 is conductive, causing the voltage at the emitter of emitter-follower transistor 35 to decrease. This is illustrated in FIG. 4 as waveform ATD* decreasing to a logic low voltage.

At time t3, control signals $FB_1$ and $FB_2$ change logic states, causing P-channel transistor 36 to become conductive and P-channel transistor 37 to be substantially non-conductive. By this time, the voltages at nodes 101 and 102 have completely transitioned to their new logic states, so that when P-channel transistor 36 becomes conductive, the voltage at the base of emitter-follower transistor 35 rises quickly, causing the voltage at the emitter of emitter-follower transistor 35 to quickly become a logic high. ATD pulse ATD* increases to a logic high voltage as shown at time t4. The time interval between time t1 and time t3 is approximately 1.2–1.4 nanoseconds. Note that the rising edge of ATD pulse ATD* increases to a logic high very quickly, as compared to its falling edge. This does not cause a problem in the preferred embodiment, because it is the rising edge of ATD pulse ATD* that initiates the preconditioning and activation signals of an integrated circuit memory. In other embodiments, ATD pulse ATD* may be provided as a positive pulse by supplying control signal $FB_1$ to the gate of P-channel transistor 36, and control signals $FB_2$ to the gate of P-channel transistor 37.

At time t5, address signal $A_{IN}$ transitions from a logic high to a logic low, which causes output node 102 to transition to a logic low and output node 101 to transition to a logic high at time t6. As the voltage at output node 102 decreases to a logic low voltage, the voltage at the base of emitter-follower transistor 35 (FIG. 1) begins to decrease, causing ATD pulse ATD* to begin to drop, as shown just after time t6. At this time, control signal $FB_1$ is still a logic high voltage and control signal $FB_2$ is a logic low voltage, thereby keeping P-channel transistor 37 conductive and P-channel transistor 36 substantially nonconductive. At time t7, control signals $FB_1$ and $FB_2$ change logic states, causing P-channel transistor 36 to become conductive and P-channel transistor 37 to be substantially non-conductive. By this time, the voltages at nodes 101 and 102 have completely transitioned to their new logic states, so that when P-channel transistor 36 becomes conductive, the voltage at the base of emitter-follower transistor 35 rises rapidly, causing emitter-follower transistor 35 to become conductive quickly. The rising edge of ATD pulse ATD* increases to a logic high voltage as shown at time t8.

The falling edge of ATD pulse ATD* is caused by whichever of nodes 101 or 102 transitions to a logic low voltage. The rising edge of ATD pulse ATD* is caused by both of control signals $FB_1$ and $FB_2$ transitioning. ATD pulse ATD* is provided by address buffer 20 each time address signal $A_{IN}$ changes logic states, either from a logic high to a logic low, or from a logic low to a logic high. ATD pulse ATD* is provided at logic levels controlled by resistors 24, 25, 33, and 38, and is active at a logic low. However, in other embodiments, ATD pulse ATD* may be provided as a logic high pulse, and/or may be provided at different logic levels, depending on the application.

Address buffer 20 provides an ATD pulse very quickly after address signal $A_{IN}$ changes logic states, because the pulse is generated in the address buffer, rather than by a separate ATD pulse generator circuit. In addition, address buffer 20 requires less surface area on an integrated circuit memory for generating an ATD pulse, since additional dedicated ATD pulse generating circuitry is not needed.

While the invention has been described in the context of a preferred embodiment, it will be apparent to those skilled in the art that the present invention may be modified in numerous ways and may assume many embodiments other than that specifically set out and described above. For example, the address buffer can be modified to receive address signals at logic levels other than ECL, such as GTL (Gunning transceiver logic), TTL (transistor-transistor logic), or CMOS (complementary metal-oxide). Accordingly, it is intended by the appended claims to cover all modifications of the invention which fall within the true spirit and scope of the invention.

What is claimed is:

1. An input buffer, comprising:

a differential amplifier, having an input terminal for receiving an input signal, the input signal having first and second logic states, the differential amplifier having first and second output nodes;

a first MOS transistor having a first current electrode coupled to the first output node of the differential amplifier, a second current electrode, and a gate for receiving a first control signal;

a second MOS transistor having a first current electrode coupled to the second output node of the differential amplifier, a second current electrode, and a gate for receiving a second control signal; and a first emitter-follower transistor having a base coupled to the second current electrodes of both the first and second MOS transistors, and an emitter for providing an output pulse in response to the input signal transitioning from the first logic state to the second logic state.

2. The input buffer of claim 1, wherein the first and second MOS transistors are both P-channel transistors.

3. The input buffer of claim 1, wherein the first and second control signals are provided to the gates of the first and second MOS transistors a predetermined time after the input signal transitions from the first logic state to the second logic state.

4. The input buffer of claim 1, wherein the emitter-follower transistor is an NPN transistor.

5. The input buffer of claim 1, further comprising:
a second emitter-follower transistor having a collector coupled to a power supply voltage terminal, a base coupled to the first output node of the differential amplifier, and an emitter for providing a first intermediate level logic signal; and
a third emitter-follower transistor having a collector coupled to the power supply voltage terminal, a base coupled to the second output node of the differential amplifier, and an emitter for providing a second intermediate level logic signal.

6. The input buffer of claim 5, further comprising a level converter circuit for receiving the first and second intermediate level logic signals, and providing the first and second control signals in response to the input signal transitioning from the first logic level to the second logic level.

7. The input buffer of claim 1, wherein the input signal is characterized as being an address signal.

8. An address buffer for generating an ATD (address transition detection) pulse, comprising:
a differential amplifier, having first and second resistors, and first and second bipolar transistors, the first resistor being coupled between a first power supply voltage terminal and a collector of the first bipolar transistor, the second resistor being coupled between the first power supply voltage terminal and a collector of the second bipolar transistor, the differential amplifier for receiving an address signal having first and second logic states;
a first MOS transistor having a first current electrode coupled to the collector of the first bipolar transistor, a second current electrode, and a gate for receiving a first delayed control signal;
a second MOS transistor having a first current electrode coupled to the collector of the second bipolar transistor, a second current electrode, and a gate for receiving a second delayed control signal;
a first emitter-follower transistor having a collector coupled to the first power supply voltage terminal, a base coupled to the second current electrodes of both the first and second MOS transistors, and an emitter for providing the ATD pulse;
a second emitter-follower transistor having a collector coupled to a power supply voltage terminal, a base coupled to the collector of the first bipolar transistor, and an emitter for providing a first buffered logic signal;
a third emitter-follower transistor having a collector coupled to the power supply voltage terminal, a base coupled to the collector of the second bipolar transistor, and an emitter for providing a second buffered logic signal; and a level converter for receiving the first and second buffered logic signals and for providing the first and second delayed control signals.

9. The address buffer of claim 8, wherein the first and second MOS transistors are both P-channel transistors.

10. The address buffer of claim 8, wherein the first and second delayed control signals are received at the gates of the first and second MOS transistors a predetermined time after the address signal transitions from the first logic state to the second logic state.

11. The address buffer of claim 8, wherein the first and second bipolar transistors and the first, second, and third emitter-follower transistors are NPN transistors.

12. The address buffer of claim 8, wherein the address signal is characterized as being an ECL level logic signal.

13. The address buffer of claim 8, wherein the first and second delayed control signals are characterized as being BICMOS level logic signals.

14. An address buffer with ATD (address transition detection) generation, comprising:
a differential amplifier, having first and second resistors, and first and second bipolar transistors, the first resistor being coupled between a power supply voltage terminal and a collector of the first bipolar transistor, the second resistor being coupled between the power supply voltage terminal and a collector of the second bipolar transistor, the differential amplifier for receiving an ECL level address signal having first and second logic states;
a first P-channel transistor having a first current electrode coupled to the collector of the first bipolar transistor, a second current electrode, and a gate for receiving a first delayed control signal;
a second P-channel transistor having a first current electrode coupled to the collector of the second bipolar transistor, a second current electrode, and a gate for receiving a second delayed control signal;
a first emitter-follower transistor having a collector coupled to the power supply voltage terminal, a base coupled to the second current electrodes of both the first and second P-channel transistors, and an emitter for providing an ATD pulse when the ECL level address signal transitions from the first logic state to the second logic state;
a second emitter-follower transistor having a collector coupled to the power supply voltage terminal, a base coupled to the collector of the first bipolar transistor, and an emitter for providing a first buffered logic signal; and
a third emitter-follower transistor having a collector coupled to the power supply voltage terminal, a base coupled to the collector of the second bipolar transistor, and an emitter for providing a second buffered logic signal.

15. The address buffer of claim 14, further comprising a level converter circuit for receiving the first and second buffered logic signals, and providing the first and second delayed control signals in response to the ECL level address signal transitioning from the first logic level to the second logic level.

16. The address buffer of claim 15, wherein the first and second delayed control signals are characterized as being BICMOS level logic signals.

* * * * *